US008947915B2

(12) United States Patent
Worledge et al.

(10) Patent No.: US 8,947,915 B2
(45) Date of Patent: Feb. 3, 2015

(54) THERMAL SPIN TORQURE TRANSFER MAGNETORESISTIVE RANDOM ACCESS MEMORY

(71) Applicant: International Business Machines Corporation, Armonk, NY (US)

(72) Inventors: Daniel C. Worledge, Cortlandt, NY (US); Guohan Hu, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 218 days.

(21) Appl. No.: 13/717,079

(22) Filed: Dec. 17, 2012

(65) Prior Publication Data

US 2014/0169080 A1  Jun. 19, 2014

(51) Int. Cl.
*G11C 11/00* (2006.01)
*G11C 11/16* (2006.01)

(52) U.S. Cl.
CPC .............. *G11C 11/16* (2013.01); *G11C 11/161* (2013.01); *Y10S 977/933* (2013.01); *Y10S 977/935* (2013.01)
USPC ........... 365/158; 365/148; 365/171; 977/933; 977/935

(58) Field of Classification Search
CPC ...................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| 6,166,948 | A | 12/2000 | Parkin et al. | |
|---|---|---|---|---|
| 6,704,220 | B2 | 3/2004 | Leuschner | |
| 7,230,844 | B2 * | 6/2007 | Deak | 365/171 |
| 7,309,617 | B2 | 12/2007 | Ruehrig et al. | |
| 7,808,027 | B2 | 10/2010 | Horng et al. | |
| 7,829,964 | B2 | 11/2010 | Chen et al. | |
| 8,039,913 | B2 | 10/2011 | Zheng et al. | |
| 2004/0095801 | A1 * | 5/2004 | Stipe | 365/158 |
| 2006/0077707 | A1 * | 4/2006 | Deak | 365/171 |

(Continued)

OTHER PUBLICATIONS

W. J. Gallagher et al., Development of the magnetic tunnel junction MRAM at IBM: From first junctions to a 16-Mb MRAM demonstrator chip, IBM J. Res. & Dev. vol. 50, No. 1, Jan. 2006, pp. 5-23A.
C.-T. Yen et al., Reduction in critical current density for spin torque transfer switching with composite free layer, Applied Physics Letters, vol. 93, Issue 9, 2008, 092504, 3 pages.

(Continued)

*Primary Examiner* — Harry W Byrne
(74) *Attorney, Agent, or Firm* — Cantor Colburn LLP; Vazken Alexanian

(57) ABSTRACT

A thermal spin torque transfer magnetoresistive random access memory (MRAM) apparatus includes a magnetic tunnel junction and a tunnel junction programming circuit. The magnetic tunnel junction includes a reference layer having a fixed magnetic polarity, a tunnel barrier layer, and a free layer on an opposite side of the tunnel barrier layer from the reference layer. The free layer includes a first layer having a first Curie temperature and a second layer having a second Curie temperature different from the first Curie temperature. The tunnel junction programming circuit is configured to apply a current through the magnetic tunnel junction to generate a write temperature in the magnetic tunnel junction and to write to the free layer of the magnetic tunnel junction.

14 Claims, 7 Drawing Sheets

(56) References Cited

U.S. PATENT DOCUMENTS

| | | |
|---|---|---|
| 2011/0110151 A1* | 5/2011 | Prejbeanu .................... 365/173 |
| 2011/0141797 A1* | 6/2011 | Slonczewski ................ 365/158 |
| 2012/0014176 A1* | 1/2012 | Slonczewski ................ 365/158 |
| 2012/0063218 A1 | 3/2012 | Huai et al. |
| 2012/0155156 A1* | 6/2012 | Watts et al. .................. 365/158 |

OTHER PUBLICATIONS

X. Yao et al., Design and Fabrication of Spin Torque Transfer Devices with Magnetic Nano-Current-Confined Structures for Lower Switching Current Density, Device Research Conference,: Jun. 23-25, 2008, pp. 219-220.

* cited by examiner

THERMAL SPIN TORQURE TRANSFER MAGNETORESISTIVE RANDOM ACCESS MEMORY

BACKGROUND

Embodiments of the invention relate generally to magnetoresistive random access memory (MRAM) and, more specifically to thermally-assisted spin torque transfer MRAM having tunnel junctions with a multi-layer free layer.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetization direction, separated by a thin insulating layer. One of the two plates is a reference magnet set to a particular polarity; the other plate's magnetization direction can be changed to be parallel or anti parallel to the magnetization of the reference magnet by field or current and is termed as "free magnet" or "free-layer". The free magnet may also be referred to as a bit, and it may store a "1" or a "0" value. This configuration is known as a magnetic tunnel junction and is the simplest structure for a MRAM bit. A memory device is built from a grid of such "cells."

One type of MRAM, called thermal MRAM, is configured to have heat applied to the tunnel junction when writing to a bit of the tunnel junction. In particular, the free magnet tends to be stable at a normal operating temperature, and it is more difficult to change magnetic polarity of the free magnet at a normal operating temperature. Providing heat to the free magnet may facilitate changing of a polarity of the free magnet to program a magnetic state of the free magnet. However, a large amount of current necessary to heat the tunnel junction to write to the tunnel junction may make the transistors in an MRAM cell too large for some applications which may contribute to electromigration problems at advanced nodes.

SUMMARY

According to one embodiment, a thermal spin torque transfer magnetoresistive random access memory (MRAM) apparatus includes a magnetic tunnel junction and a tunnel junction programming circuit. The magnetic tunnel junction includes a reference layer having a fixed magnetic polarity, a tunnel barrier layer, and a free layer on an opposite side of the tunnel barrier layer from the reference layer. The free layer includes a first layer having a first Curie temperature and a second layer having a second Curie temperature different from the first Curie temperature. The tunnel junction programming circuit is configured to apply a current through the magnetic tunnel junction to generate a write temperature in the magnetic tunnel junction and to write to the free layer of the magnetic tunnel junction.

According to one embodiment, a magnetic tunnel junction of a thermal spin torque transfer magnetoresistive random access memory (MRAM) cell includes a reference layer having a fixed magnetic polarity, a tunnel barrier layer, and a free layer on an opposite side of the tunnel barrier layer from the reference layer. The free layer includes a first layer having a first Curie temperature and a second layer having a second Curie temperature less than the first Curie temperature.

Another embodiment of the invention includes a method of writing to a tunnel junction of a thermal spin torque transfer magnetoresistive random access memory (MRAM) apparatus. The thermal spin torque transfer MRAM apparatus includes a magnetic tunnel junction having a reference layer, a tunnel barrier layer, and a free layer, the free layer comprising a first layer having a first Curie temperature and a second layer having a second Curie temperature. The method includes applying a write current to the magnetic tunnel junction to heat the magnetic tunnel junction to a write temperature less than the first Curie temperature and greater than the second Curie temperature.

Additional features and advantages are realized through the techniques of the present invention. Other embodiments and aspects of the invention are described in detail. For a better understanding of embodiments of the invention, refer to the description and to the drawings.

BRIEF DESCRIPTION OF THE SEVERAL VIEWS OF THE DRAWINGS

Features characterizing embodiments of the present invention are described in the specification and claims which follow. These features, and advantages of embodiments of the invention are apparent from the following detailed description taken in conjunction with the accompanying drawings in which:

DETAILED DESCRIPTION

Conventional MRAM devices require a large amount of current to write to a free layer of a tunnel junction. Embodiments of the present invention are directed to an a thermal spin torque transfer MRAM device having tunnel junctions with multiple layers of different Curie temperatures, where at least one of the layers is non-magnetic at a write temperature to reduce a current necessary to write to the free layer of the tunnel junction.

Figure 1:
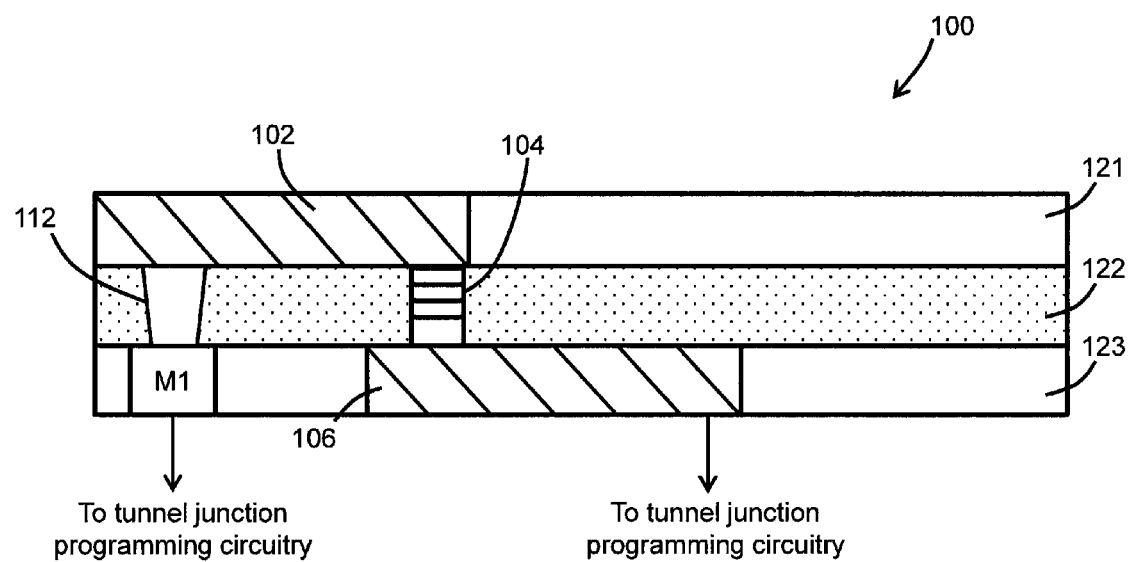
FIG. 1 illustrates a thermal spin torque transfer magnetoresistive random access memory (MRAM) apparatus according to one embodiment of the present invention.

FIG. 1 illustrates a thermal spin torque transfer magnetoresistive random access memory (MRAM) circuit 100 according to one embodiment of the present invention. In particular, FIG. 1 illustrates a side view of a cross-section of a portion of a thermal spin torque transfer MRAM apparatus 100, which for purposes of this description may also be referred to only as an MRAM apparatus 100. In embodiments of the present invention, the MRAM apparatus 100 may correspond to one thermal spin torque MRAM cell from among a series of thermal spin torque MRAM cells arranged in series and/or in parallel to form memory arrays or other memory structures for storing data. The MRAM apparatus 100 may include multiple insulating layers 121, 122 and 123. One or more of the insulating layers 121-123 may include metal layers formed therein, such as wiring layers (e.g., M1) and vias that connect wiring layers.

The MRAM apparatus 100 includes an upper contact line 102, a magnetic tunnel junction 104 (referred to hereinafter as "tunnel junction"), and a lower line 106. The tunnel junction 104 is connected to both the upper contact line 102 and the lower line 106. The lower contact line 106 may be directly connected to tunnel junction programming circuitry, or the lower contact line 106 may be connected to the tunnel junction programming circuitry by way of one or more vias and wiring layers extending through one or more insulating layers. The upper contact line 102 and lower line 106 may both be conductive lines or wires, such as metal wiring forming in wiring layers of a semiconductor device.

The upper contact line 102 may also be connected directly to tunnel junction programming circuitry, or the upper contact line 102 may be connected to the tunnel junction programming circuitry by way of vias and metal layer contacts, such as via 112 and metal layer M1. The tunnel junction programming circuitry may include any type of selection circuitry including one or more transistors that may be switched on and off to supply current through the tunnel junction 104 by way of the upper and lower contact lines 102 and 106.

Embodiments of the invention are not limited to this particular cross-sectional configuration of the upper and lower contact lines 102 and 106 and the tunnel junction 104. Instead, the configuration of FIG. 1 is provided for purposes of description, and embodiments of the invention encompass upper and lower contact lines 102 and 106 and the tunnel junction 104 having varying horizontal and vertical arrangements.

The insulation layers 121-123 may be formed of any insulating material, such as semiconductor materials. Some examples include silicon nitride and silicon oxide. The upper and lower contact lines 102 and 106 may be formed of low-resistivity metals, such as aluminum and copper. The via 112 may also be formed of low-resistivity metals or fillers. Although some examples of insulating materials, low-resistivity metals and high-resistivity metals have been provided, embodiments of the invention are not limited to these examples, and any type of insulating materials and metals may be used in association with embodiments of the invention.

In embodiments of the present invention, the tunnel junction 104 includes a reference layer, a tunnel barrier layer and a free layer having multiple layers of varying Curie temperatures, Tc. The tunnel junction 104 may be formed by any deposition process for depositing different materials on top of each other.

Figure 2:
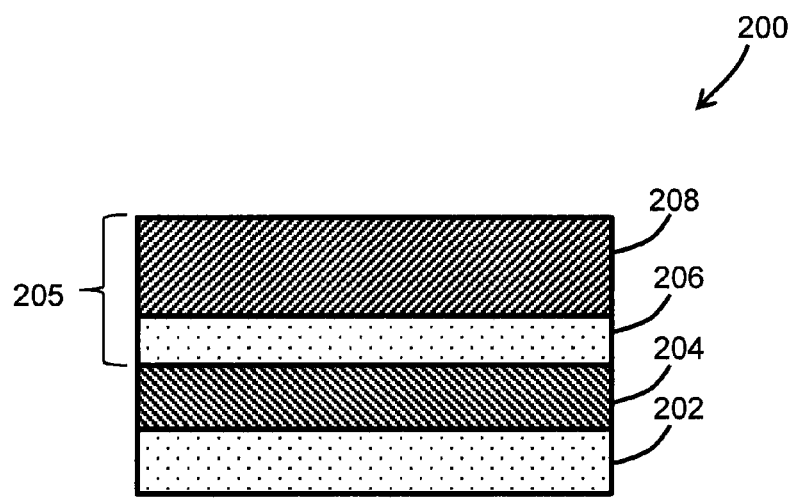
FIG. 2 illustrates a tunnel junction of a thermal spin torque transfer MRAM apparatus according to one embodiment of the invention.
Figure 3:
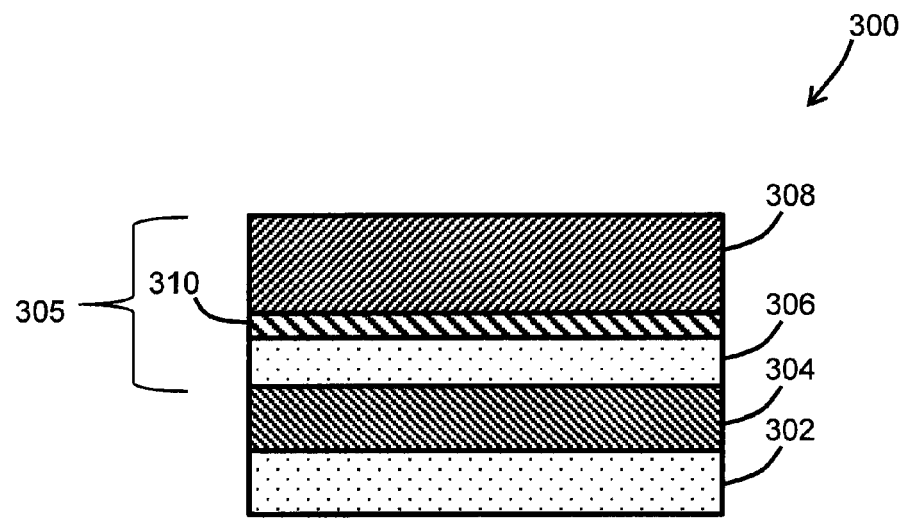
FIG. 3 illustrates a tunnel junction of a thermal spin torque transfer MRAM apparatus according to another embodiment of the invention.
Figure 4:
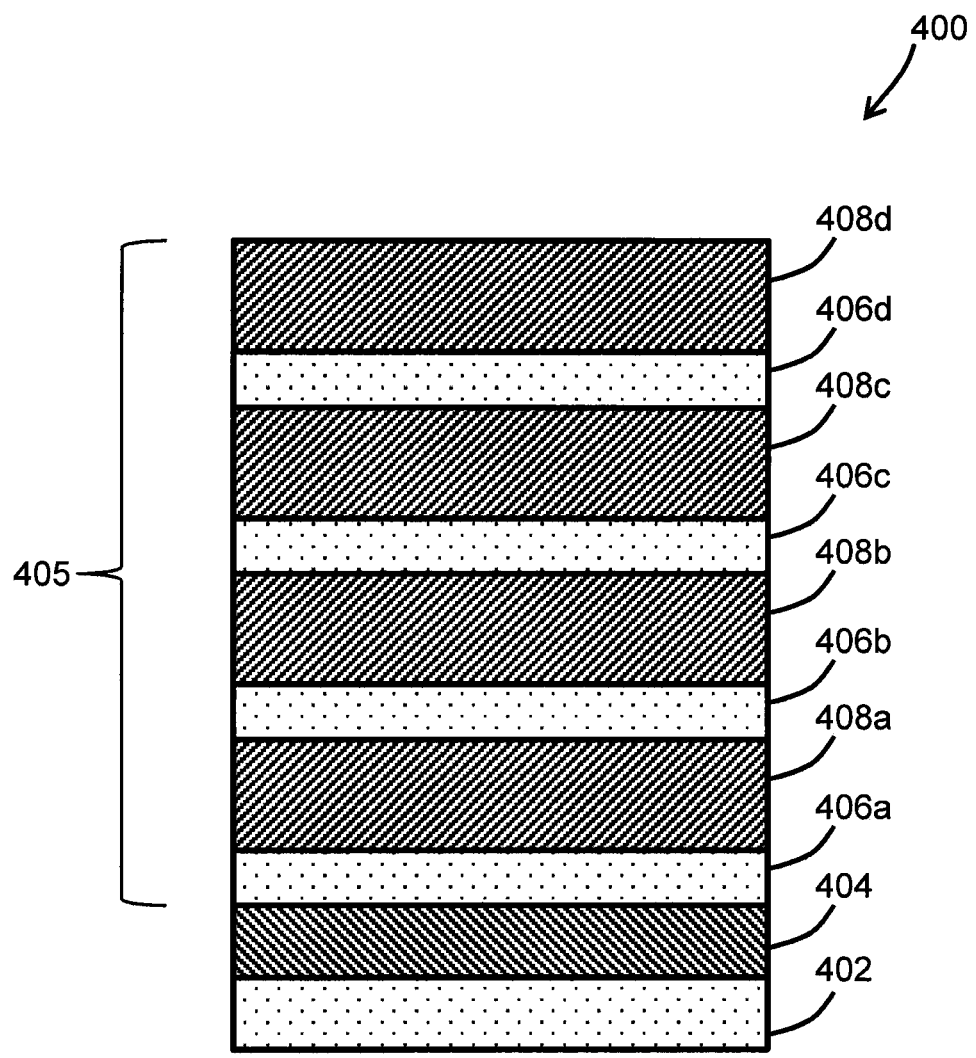
FIG. 4 illustrates a tunnel junction of a thermal spin torque transfer MRAM apparatus according to yet another embodiment of the invention.

FIGS. 2-4 illustrate example configurations of tunnel junctions having multi-layered free layers according to some embodiments of the invention. These embodiments are provided as examples, only, and the present invention encompasses any tunnel junction having free layers with multiple layers of varying Curie temperatures, Tc.

Referring to FIG. 2, a tunnel junction 200 includes a reference layer 202, a tunnel barrier layer 204 and a free layer 205. The tunnel junction 200 may correspond to the tunnel junction 104 of FIG. 1. The free layer 205 includes a high Curie temperature layer 206 and a low Curie temperature layer 208, wherein the Curie temperature Tc is defined as a temperature at which a material becomes non-magnetic. In addition, the Curie temperature Tc may also be referred to as a de-magnetization temperature in this specification.

The high Curie temperature layer 206 and a low Curie temperature layer 208 have a combined thermal stability at room temperature that defines the thermal stability of the free layer 205 at room temperature, or at a non-write operating temperature. The thermal stability is defined as $E/k_B T$, where E represents an energy potential, a magnetic energy or an energy needed to change a magnetization polarization of the free layer 205; $k_B$ represents the Boltzmann constant; and T represents an ambient temperature. The ambient temperature may change depending on the environment. For example, during normal read operations or any other non-write state of the MRAM apparatus 100, the temperature T may be below 100 degrees Celsius (° C.), such as around 85° C. and during a write operation, the temperature T may be between 100° C. and 200° C.

As an example, an MRAM cell may be designed to have a ten-year retention capability at a non-write operating temperature, or at around 85° C., where the retention capability is defined as the ability of the free layer 205 to retain a stored magnetic alignment for ten years. In such an MRAM cell, the thermal stability may need to be ≥60, or in other words, $E \geq 60\ k_B T$. In embodiments of the present invention, the high Curie temperature layer 206 and the low Curie temperature layer 208 are designed such that their combined magnetic energy is equal to or greater than $60\ k_B T$. In addition, the high Curie temperature layer 206 is designed such that its magnetic energy is at least $10\ k_B T$ to avoid thermal upset during switching. For example, the high Curie temperature layer 206 may have a magnetic energy of $15\ k_B T$ at around 85° C. and the low Curie temperature layer 208 may have a magnetic energy of $45\ k_B T$ at around 85° C.

The high Curie temperature layer 206 and the low Curie temperature layer 208 each have characteristic current temperature values $Tc_1$ and $Tc_2$, respectively, defining temperatures at which the high Curie temperature layer 206 and the low Curie temperature layer 208, respectively, become non-magnetic. The temperature, T, applied to the tunnel junction 200 is increased by increasing a current applied to the tunnel junction 200 to pass through the tunnel junction 200. In embodiments of the present invention, the temperature, T, applied to the tunnel junction 200 is less than the Curie temperature $Tc_1$ of layer 206 and greater than the Curie temperature $Tc_2$ of layer 208. Or in other words, $Tc_1 > T > Tc_2$.

In the example in which the free layer 205 is configured to have a magnetic energy of $60\ k_B T$ at 85° C., the write temperature of the tunnel junction 200 may be between 100° C. and 200° C. Therefore, during non-write operations of the circuit, the temperature, T, may be less than both $Tc_1$ and $Tc_2$, and the free layer 205 may have a thermal stability represented by the equation $E = 60\ k_B T$. However, during a write operation, the temperature, T, may be higher than $Tc_2$ and lower than $Tc_1$, causing the low Curie temperature layer 208 to lose its magnetization and resulting in a thermal stability of the free layer 205 that may be represented by the equation $E = 15\ k_B T$, corresponding to the magnetic stability only of the high Curie temperature layer 206. Accordingly, less energy may be required to change the magnetic polarity of the free layer 205.

Describing a write operation generally, when a write operation is to be performed, a current is applied to the tunnel junction 200 to heat the tunnel junction 200. Electrons in the current may have a predetermined spin to cause an alignment of the layers 206 and 208 in a predetermined direction. The temperature, T, applied to the tunnel junction 200 is less than the Curie temperature $Tc_1$ of the high Curie temperature layer 206 and greater than the Curie temperature $Tc_2$ of the low Curie temperature layer 208. Consequently, the low Curie temperature layer 208 loses its magnetization while the high Curie temperature layer 206 retains its magnetization.

Since the low Curie temperature layer 208 is non-magnetic, and only the high Curie temperature layer 206 is magnetic, the free layer 205 becomes easy to switch. For example, in an embodiment in which the thermal stability of the free layer 205 is represented by the equation $E=60\,k_BT$ at a temperature of 85° C., the thermal stability of the free layer 205 may be only $E=15\,k_BT$ at a write temperature of 200° C. As a result, only one quarter of the normal current is required to change the magnetic polarity of the free layer 205.

Although a thermal stability of 60 $k_BT$ is provided as an example, the normal operating thermal stability and the thermal stability of the high and low Curie temperature layers 206 and 208 may be set at predetermined levels according to design considerations of the circuit, such as a desired retention capability of the tunnel junction. For example, a higher retention capability may be achieved with a free layer 205 having a thermal stability of $E=80\,k_BT–100\,k_BT$. In addition, the high Curie temperature layer 206 may have a thermal stability of as low as $E=10\,k_BT$. The thermal stability of the high Curie temperature layer 206 and the low Curie temperature layer 208 may be obtained by different materials and properties, such as thicknesses and compositions, of the high Curie temperature layer 206 and the low Curie temperature layer 208.

The reference layer 202 may comprise ferromagnetic materials with perpendicular anisotropy, such as multilayers including, but not limited to, Co|Ni, Co|Pt or Co|Pd; Rare earth—transition metal alloys, including, but not limited to, CoTb, FeTb, CoFeTb, CoGd, FeGd and CoFeGd; and materials with interfacial perpendicular anisotropy, such as CoFeB grown on or capped with appropriate materials. The reference layer 202 has a fixed or pinned magnetic orientation. The tunnel barrier layer 204 may comprise a non-conductive material or an insulator, such as $Al_2O_3$, $TiO_2$, MgO, SrTiO3 or $MgAl_2O_4$. The high Curie temperature layer 206 may comprise materials such as CoFeB or bilayer of Fe|CoFeB and CoFe|CoFeB, with perpendicular magnetic anisotropy. The materials listed above usually exhibit in-plane magnetic anisotropy. But by engineering the layer right on top of it, perpendicular anisotropy can be easily achieved.

The low Curie temperature layer 208 may comprise materials with perpendicular anisotropy, such as multilayers of Co|Ni—Cu, Co|Pd or Co|Pt with the right layer thickness and rare earth transition metal alloys. The low Curie temperature layer 208 may also comprise materials with Ta, Cr, Cu or oxide doped CoFeB with perpendicular anisotropy. While a few examples of materials have been provided for purposes of description, embodiments of the invention encompass any materials with perpendicular anisotropy, where one material has a higher Curie temperature than another material, and where the materials are selected to have a combined thermal stability or energy potential having a predetermined value.

The thicknesses of the respective layers of the tunnel junction 200 may vary according to design considerations. For example, the thicknesses of the layers of the tunnel junction 200 may be designed to have predetermined thicknesses, to have thicknesses within predetermined ranges, to have thicknesses having fixed ratios with respect to each other, or to have thicknesses based on any other consideration or combination of considerations. For example, the reference layer 202 may have a thickness in a range from around 1 nm to around 50 nm. The tunnel barrier layer 204 may have a thickness in a range from around 0.5 nm to around 2 nm. The high Curie temperature layer 206 may have a thickness in a range from around 0.5 nm to around 5 nm. The low Curie temperature layer 208 may have a thickness in a range from around 1 nm to around 10 nm.

FIG. 3 illustrates a tunnel junction 300 similar to the tunnel junction 200 of FIG. 2, including a reference layer 302, tunnel barrier layer 304 and free layer 305 including a high Curie temperature layer 306 and low Curie temperature layer 308. The tunnel junction 300 may correspond to the tunnel junction 104 of FIG. 1. The tunnel junction 300 further includes a spacer layer 310. The spacer layer 310 may be a non-magnetic material, such as tantalum, Ru, Pd, Pt or oxides and may be selected to de-couple the high Curie temperature layer 306 from the low Curie temperature layer 308 at the write temperature. Other examples of materials that may be used to form the spacer layer 310 include weak magnetic materials with low Curie temperatures such as Ta, Cr, Cu or an oxide doped CoFeB. The Curie temperature of the spacer layer should be equal or lower than $Tc_2$, but higher than the non-write operation temperature. The thickness of the spacer layer can range from around 0.2 nm to around 2 nm.

While FIGS. 2 and 3 illustrate one high Curie temperature layer and one low Curie temperature layer, any number of stacked low and high Curie temperature layers may be used when arranged appropriately. FIG. 4 illustrates one example of a tunnel junction 400 including a reference layer 402, tunnel barrier layer 404 and free layer 405. The free layer includes multiple high Curie temperature layers 406a, 406b, 406c and 406d alternatingly stacked with multiple low Curie temperature layers 408a, 408b, 408c and 408d. 406a is relatively thicker than the other high Curie temperature layers, which maintains a $T_{C1}$ higher than the non-write operating temperature. The tunnel junction 400 may correspond to the tunnel junction 104 of FIG. 1.

While FIGS. 2-4 illustrate examples in which a low-Curie temperature layer (208, 308, 408) is located above a high-Curie temperature layer (206, 306, 406) relative to a tunnel barrier layer (204, 304, 404), embodiments of the present invention encompass alternative configurations. For example, referring to FIG. 2, the high-Curie temperature layer 206 may be positioned above the low-Curie temperature layer 208 relative to the tunnel barrier layer 204. The reference layer is on top of the tunnel barrier in this arrangement. In addition, the high-Curie temperature layer 206 may be of a same thickness or a greater thickness than the low-Curie temperature layer 208.

Figure 5:
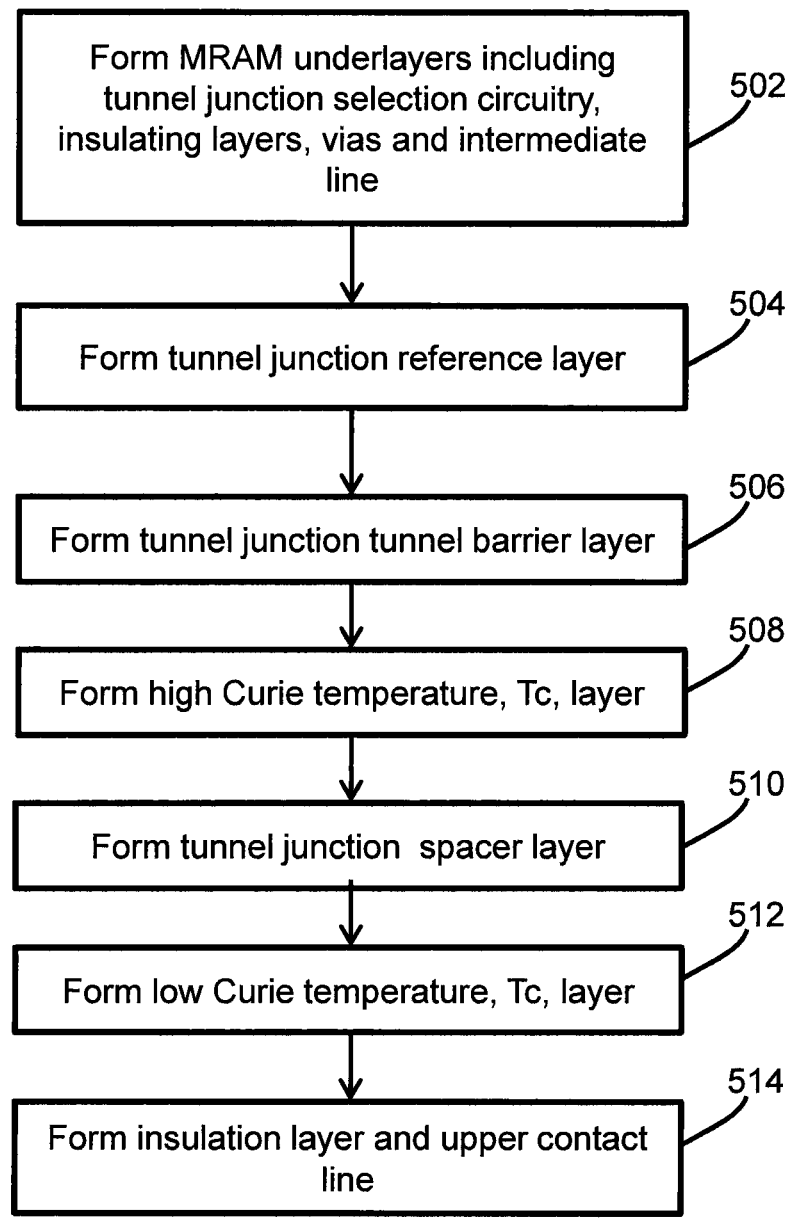
FIG. 5 is a flow diagram of a method of forming a thermal spin torque transfer MRAM apparatus according to one embodiment of the invention.

FIG. 5 illustrates a flow diagram of a method of forming a thermal spin torque MRAM apparatus according to an embodiment of the invention. In some embodiments, tunnel junction programming circuitry, such as transistors, is formed in block 602. Insulating layers, metal layers and vias may be formed on the tunnel junction selection circuitry. A lower contact line may also be formed. An insulating layer may be formed on the lower contact line.

In block 504, a reference layer of a tunnel junction is formed. The reference layer may be formed, for example, by any deposition process. The reference layer may be formed of a ferromagnetic material, such as multilayers including, but not limited to, Co|Ni, Co|Pt or Co|Pd; Rare earth—transition metal alloys, including, but not limited to, CoTb, FeTb, CoFeTb, CoGd, FeGd and CoFeGd; and materials with interfacial perpendicular anisotropy, such as CoFeB grown on or capped with appropriate materials.

In block 506, a tunnel junction tunnel barrier layer is formed on the reference layer. The tunnel junction tunnel barrier layer may be formed, for example, by any deposition process, and may be a non-conductive material, such as $Al_2O_3$, $TiO_2$, MgO, SrTiO3 or $MgAl_2O_4$.

In block 508, a high Curie temperature layer is formed on the tunnel junction barrier layer. The high Curie temperature layer may be formed of a ferromagnetic material having a Tc higher than a temperature at which a write operation is to be performed in the tunnel junction during operation of the tunnel junction. Examples of materials for forming a high Curie temperature layer include CoFeB or bilayer of Fe|CoFeB and CoFe|CoFeB, with perpendicular magnetic anisotropy.

In block 510, a spacer layer 510 is formed on the high Curie temperature layer. The spacer layer 510 may be formed by deposition, and may be formed of a non-magnetic material, such as Ta, Ru, Pd, Pt or oxides. It can also be weak magnetic materials with low Curie temperatures such as Ta, Cr, Cu or an oxide doped CoFeB.

In block 512, a low Curie temperature layer is formed on the spacer layer. The low Curie temperature layer may be formed of a ferromagnetic material having a Tc lower than a temperature at which a write operation is to be performed in the tunnel junction during operation of the tunnel junction. Examples of materials for forming a low Curie temperature layer include multilayers of Co|Ni—Cu, Co|Pd or Co|Pt with the right layer thickness and rare earth transition metal alloys. The low Curie temperature layer may also comprise materials with Ta, Cr, Cu or oxide doped CoFeB with perpendicular anisotropy.

In block 514, an upper contact line is formed on the insulating layer to contact the tunnel junction.

In embodiments of the invention, the formation of insulating layers may be performed by any deposition or growth process, including chemical vapor deposition, bath deposition or any other process. In addition, the vias may be formed by any process, such as chemical, laser or physical etching, cutting or drilling. The contact lines and wiring may be formed by any deposition process, photolithography or any other process.

In embodiments of the invention, a free layer of the tunnel junction is formed to have multiple layers of different Curie temperatures. The materials and characteristics of the multiple layers are selected such that during a write operation, a low Curie temperature layer is non-magnetic and a high Curie temperature layer is magnetic. The materials and characteristics of the multiple layers are also selected such that a thermal stability of the free layer of the tunnel junction at a predetermined non-write temperature, or a predetermined range of non-write temperatures, has a predetermined value comprising the sum of the thermal stability of each of the low Curie temperature layer and the high Curie temperature layer.

Figure 6:
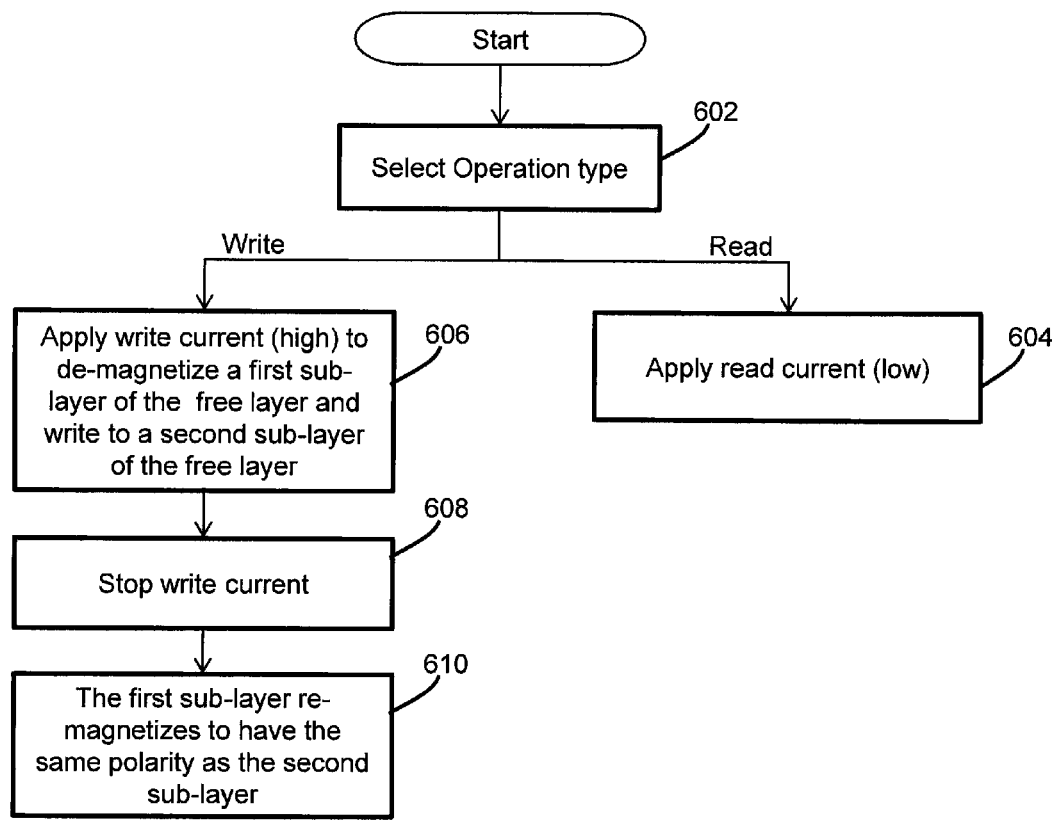
FIG. 6 is a block diagram of a process for operating a thermal spin torque transfer MRAM apparatus according to one embodiment of the invention.

FIG. 6 is a block diagram illustrating a process for operating an MRAM apparatus including a tunnel junction, such as the MRAM apparatus of FIG. 1, according to one embodiment. In block 602, an operation is selected. If a read operation is to be performed, then a read current is applied to the tunnel junction in block 604 and a magnetic polarity of the free layer of the tunnel junction is determined to determine a state of a bit of data represented by the magnetic polarity.

If a write operation is selected, then a write current is applied to the tunnel junction in block 606. The write current is greater than the read current. The write current comprises electrons having a predetermined spin torque to program a magnetic polarity of the tunnel junction. In addition, the write current heats the magnetic tunnel junction to a temperature that is greater than the Curie temperature of a first sub-layer of the free layer (such as the second layer 208 of FIG. 2) and less than the Curie temperature of a second sub-layer of the free layer (such as the first layer 206 of FIG. 2). Accordingly, the write current de-magnetizes the first sub-layer.

In block 608, the write current is stopped, and the second sub-layer stays programmed. In block 610, the first sub-layer becomes re-magnetized as the temperature of the tunnel junction drops below the Curie temperature of the first sub-layer. Upon being re-magnetized, the first sub-layer adopts the magnetic polarity of the second sub-layer.

By the above method, an entire tunnel junction having a high thermal stability may be programmed by applying a current sufficient to program only one sub-layer of the free layer of the tunnel junction.

Figure 7:
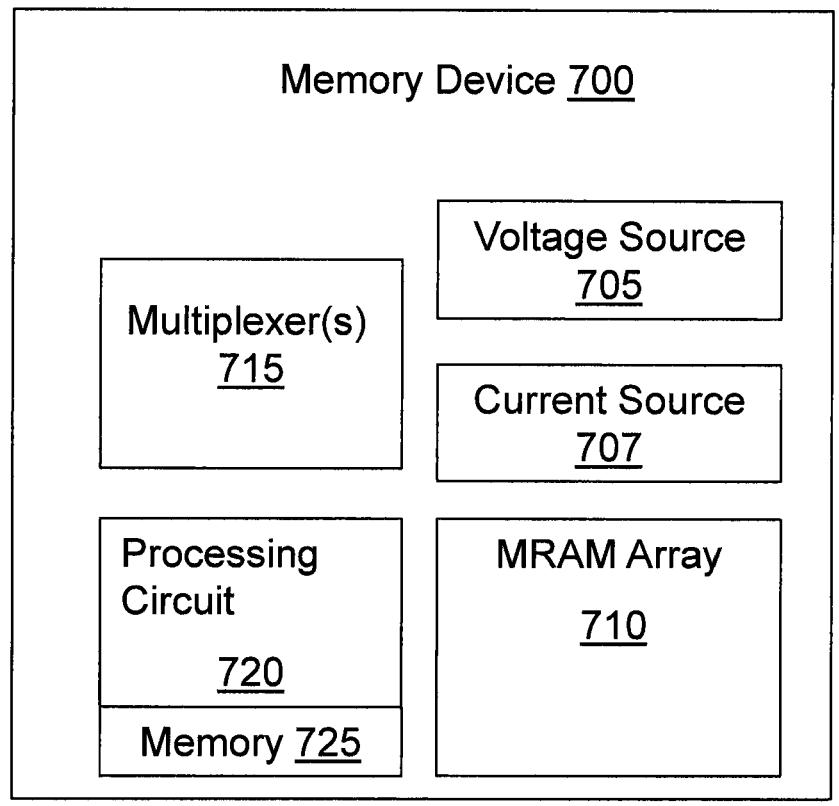
FIG. 7 illustrates a memory device according to an embodiment.

FIG. 7 illustrates a memory device 700 which includes an MRAM array 710 including a plurality of thermal spin torque MRAM apparatuses 100, as illustrated in FIG. 1. The memory device 700 is controlled by a memory controller which is a processing circuit 720 as understood by one skilled in the art. The processing circuit 720 may be an application specific integrated circuit (ASIC) for operating the MRAM array 710. Also, the processing circuit 720 can execute instructions stored in memory 725 to operate the MRAM array 710. The memory device 700 includes and/or is operatively connected to one or more voltage sources 705 supplying voltage bias V to the MRAM array 710 as directed by the processing circuit 720, multiplexers 715 directing signals and current sources 707 supplying electrical current to the write bit lines 114, lower and upper contact lines 110 and 102 and tunnel junction selection circuitry as directed by the processing circuit 720.

Figure 8:
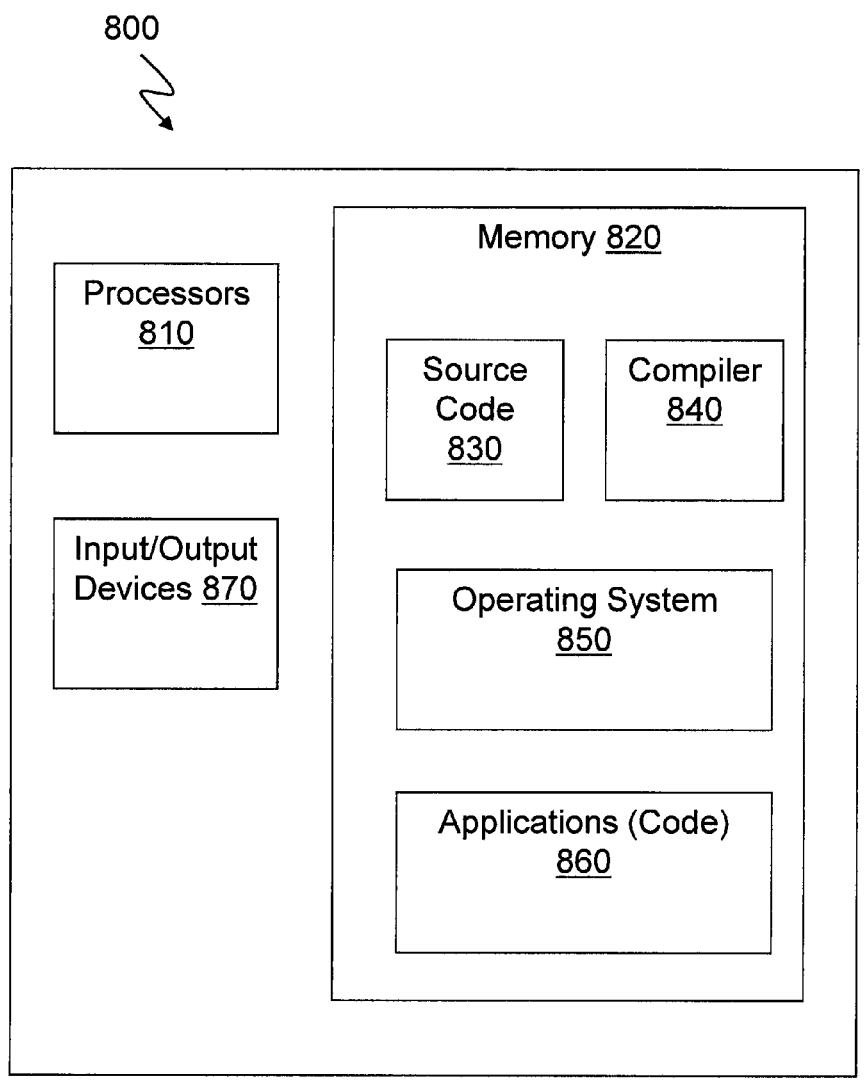
FIG. 8 illustrates a computer including a thermal spin torque transfer MRAM array according to an embodiment.

FIG. 8 illustrates an example of a computer 800 (which may include the memory device 700 to operate the features disclosed herein) which may be included in exemplary embodiments. Various methods, procedures, modules, flow diagrams, tools, applications, circuits, elements, equations, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may be utilized to implement, to incorporate, to connect to, and/or to support any element discussed herein (as understood by one skilled in the art) in FIGS. 1-7, such as reading data from the tunnel junction 104 or writing data to the tunnel junction 104.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a microprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 820 may incorporate electronic, magnetic, optical, and/or other types of storage media. Note that the memory 820 can have a distributed architecture, where various components are situated remote from one another, but can be accessed by the processor 810.

In one embodiment, the memory 820 includes an array of MRAM apparatuses 100 of FIG. 1. For example, the array of MRAM apparatuses 100 may form non-volatile magnetic memory.

The software in the computer readable memory 820 may include one or more separate programs, each of which comprises an ordered listing of executable instructions for implementing logical functions. The software in the memory 820 includes a suitable operating system (0/S) 850, compiler 840, source code 830, and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

In some embodiments, one or more of the operating system and the application 860 may include computer code for controlling read and write operations from and to the MRAM apparatus 100 of FIG. 1.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

When the application 860 is implemented in software it should be noted that the application 860 can be stored on virtually any computer readable storage medium for use by or in connection with any computer related system or method. The application 860 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 800 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as an apparatus, system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the disclosure in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While a preferred embodiment has been described, it will be understood that those skilled in the art, both now and in the future, may make various improvements and enhancements which fall within the scope of the claims which follow.

What is claimed is:

1. A thermal spin torque transfer magnetoresistive random access memory (MRAM) apparatus, comprising:
   a magnetic tunnel junction comprising a reference layer having a fixed magnetic polarity, a tunnel barrier layer, and a free layer on an opposite side of the tunnel barrier layer from the reference layer, the free layer comprising a first layer having a first Curie temperature and a second layer having a second Curie temperature different from the first Curie temperature; and
   a tunnel junction programming circuit configured to apply a current through the magnetic tunnel junction to generate a write temperature in the magnetic tunnel junction and to write to the free layer of the magnetic tunnel junction.

2. The thermal spin torque transfer MRAM apparatus of claim 1, wherein the first Curie temperature greater than the write temperature of the magnetic tunnel junction and the second Curie temperature is less than the write temperature of the magnetic tunnel junction.

3. The thermal spin torque transfer MRAM apparatus of claim 1, wherein the first Curie temperature is greater than 150 degrees Celsius (° C.) and the second Curie temperature is less than 200° C.

4. The thermal spin torque transfer MRAM apparatus of claim 1, wherein both the first and second Curie temperatures are greater than a non-write operating temperature of the magnetic tunnel junction.

5. The thermal spin torque transfer MRAM apparatus of claim 1, wherein the first and second layers have a combined thermal stability corresponding to a target magnetic polarization retention capability at a predetermined non-write operating temperature.

6. The thermal spin torque transfer MRAM apparatus of claim 1, wherein the first layer has a magnetic energy between around 10 $k_B T$ and around 20 $k_B T$, wherein $k_B$ is the Boltzmann constant and T is an ambient temperature.

7. The thermal spin torque transfer MRAM apparatus of claim 1, further comprising:
 a non-magnetic spacer between the first layer and the second layer.

8. The thermal spin torque transfer MRAM apparatus of claim 1, wherein the free layer includes multiple first layers stacked in an alternating configuration with multiple second layers.

9. The thermal spin torque transfer MRAM apparatus of claim 1, wherein the second layer has a higher thermal stability than the first layer at non-write operating temperature.

10. A magnetic tunnel junction of a thermal spin torque transfer magnetoresistive random access memory (MRAM) cell, comprising:
 a reference layer having a fixed magnetic polarity;
 a tunnel barrier layer; and
 a free layer on an opposite side of the tunnel barrier layer from the reference layer, the free layer comprising a first layer having a first Curie temperature and a second layer having a second Curie temperature less than the first Curie temperature.

11. The magnetic tunnel junction of claim 10, wherein the first layer has a Curie temperature greater than a write temperature of the magnetic tunnel junction and the second layer has a Curie temperature less than the write temperature of the magnetic tunnel junction.

12. The magnetic tunnel junction of claim 10, wherein the first and second layers have a combined thermal stability corresponding to a target magnetic polarization retention capability at a predetermined non-write operating temperature.

13. The magnetic tunnel junction of claim 10, wherein the first layer has a magnetic energy between around 10 $k_B T$ and around 20 $k_B T$, wherein $k_B$ is the Boltzmann constant and T is an ambient temperature.

14. The magnetic tunnel junction of claim 10, further comprising:
 a non-magnetic spacer between the first layer and the second layer.

* * * * *